(12) United States Patent
Harazono et al.

(10) Patent No.: US 8,863,377 B2
(45) Date of Patent: Oct. 21, 2014

(54) METHOD FOR MANUFACTURING CIRCUIT BOARD AND METHOD FOR MANUFACTURING STRUCTURE USING THE SAME

(75) Inventors: Masaaki Harazono, Yasu (JP); Takayuki Umemoto, Yasu (JP)

(73) Assignee: Kyocera Corporation, Kyoto (JP)

( * ) Notice: Subject to any disclaimer, the term of this patent is extended or adjusted under 35 U.S.C. 154(b) by 814 days.

(21) Appl. No.: 13/094,991

(22) Filed: Apr. 27, 2011

(65) Prior Publication Data

US 2011/0314666 A1    Dec. 29, 2011

(30) Foreign Application Priority Data

Apr. 27, 2010 (JP) ................................ 2010-102394
Apr. 27, 2011 (JP) ................................ 2011-099208

(51) Int. Cl.
*H05K 3/02* (2006.01)
*H05K 3/10* (2006.01)
*H05K 3/46* (2006.01)

(52) U.S. Cl.
CPC ...... *H05K 3/4644* (2013.01); *H05K 2201/0195* (2013.01); *H05K 2201/09536* (2013.01); *H05K 2201/0959* (2013.01); *H05K 2203/0307* (2013.01)
USPC .................. 29/846; 29/830; 29/832; 174/256

(58) Field of Classification Search
CPC ..................... H05K 3/383; H05K 2203/0307
USPC .................. 29/830, 831, 832, 846, 847, 852; 174/256, 260, 262; 216/18, 105; 428/161
See application file for complete search history.

(56) References Cited

U.S. PATENT DOCUMENTS 6,762,921 B1 *  7/2004  Asai et al. ............. 361/111
8,052,882 B2 * 11/2011  Kondo ................... 216/18
2009/0283497 A1 11/2009  Kondo

FOREIGN PATENT DOCUMENTS

JP         2009277905         11/2009

* cited by examiner

*Primary Examiner* — Donghai D Nguyen
(74) *Attorney, Agent, or Firm* — Volpe and Koenig, P.C.

(57) ABSTRACT

According to one embodiment of the invention, a method for manufacturing a circuit board comprises covering with a metal layer a surface of a first resin layer including polyimide resin; forming a plurality of conductive layers arranged on the metal layer with the conductive layers apart from each other in a planer view; roughening surfaces of the conductive layers with an alkaline aqueous solution; and etching a part of the metal layer between the conductive layers in the planer view to expose the surface of the first resin layer after roughening the surfaces of the conductive layers.

7 Claims, 7 Drawing Sheets

METHOD FOR MANUFACTURING CIRCUIT BOARD AND METHOD FOR MANUFACTURING STRUCTURE USING THE SAME

BACKGROUND OF THE INVENTION

1. Field of the Invention

The present invention relates to a method for manufacturing a circuit board used in electronic devices (e.g., various types of audio visual devices, home electronics, communication devices, computer devices, and peripheral devices thereof), and a method for manufacturing a mounting structure of the same.

2. Description of the Related Art

A mounting structure in which electronic components are mounted on a circuit board is conventionally used for the mounting structure in an electronic device.

Japanese Laid-Open Patent Publication No. 2009-277905 describes a method for manufacturing a circuit board including the steps of forming a seed layer on a base layer, forming a copper plated layer on the seed layer, obtaining a circuit layer by etching the seed layer using the copper plated layer as a mask, and roughening a surface of the circuit layer using an alkaline aqueous solution.

In the method for manufacturing the circuit board described in the above reference, if a resin layer containing polyimide resin is used as the base layer, the imide ring contained in the resin molecule of the polyimide resin exposed at the surface of the resin layer is easily hydrolyzed by the alkaline aqueous solution used to roughen the surface of the circuit layer. As a result, the carboxyl group is produced by such hydrolysis so that the conductive material of the circuit layer ionizes and bonds with the carboxyl group, whereby the insulation property easily lowers between the circuit layers. Therefore, the circuit layers are easily short circuited, and furthermore, the electrical reliability of the circuit board easily lowers.

BRIEF SUMMARY OF THE INVENTION

The present invention provides a method for manufacturing a circuit board and a method for manufacturing a mounting structure thereof in response to the demand to enhance the electrical reliability.

According to one embodiment of the invention, a method for manufacturing a circuit board comprises covering with a metal layer a surface of a first resin layer including polyimide resin; forming a plurality of conductive layers arranged on the metal layer with the conductive layers apart from each other in a planer view; roughening surfaces of the conductive layers with an alkaline aqueous solution; and etching a part of the metal layer between the conductive layers in the planer view to expose the surface of the first resin layer after roughening the surfaces of the conductive layers.

According to another embodiment of the invention, a method for manufacturing a structure comprises connecting an electronic component electrically to the circuit board.

Figure 1A:
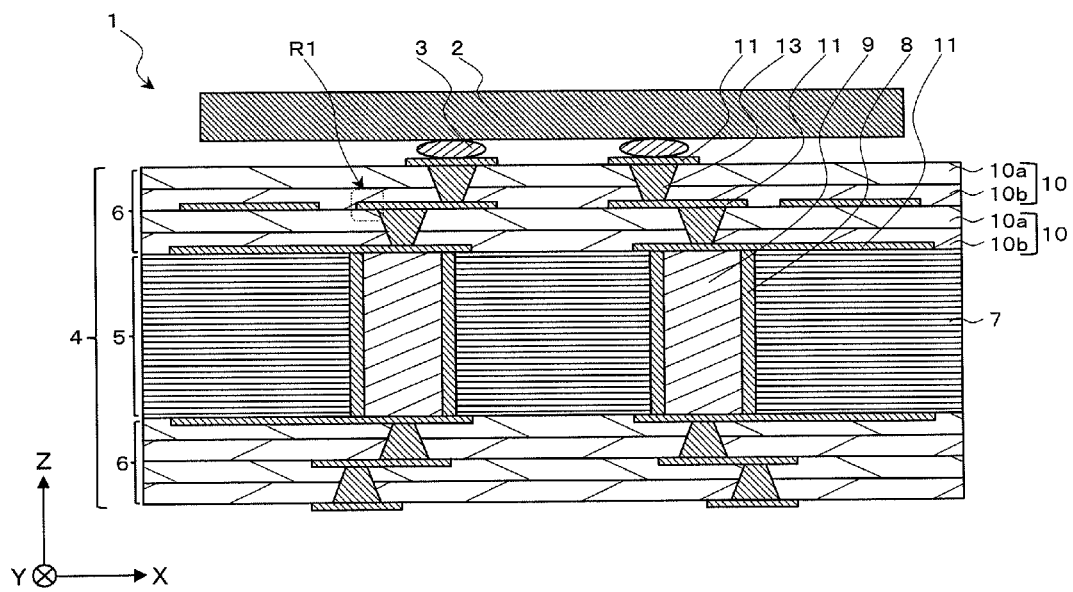
FIG. 1A is a cross-sectional view in which a mounting structure according to one embodiment of the present invention is cut along a thickness direction.

REFERENCE NUMERALS 1 mounting structure
2 electronic component
3 bump
4 circuit board
5 core substrate
6 circuit layer
7 base body
8 through-hole conductor
9 insulator
10 insulating layer
10a first resin layer
10b second resin layer
11 conductive layer
12 metal layer
13 via conductor
V via hole

DETAILED DESCRIPTION OF EXEMPLARY EMBODIMENTS

Hereinafter, a method for manufacturing a circuit board according to one embodiment of the present invention is described in detail with reference to the drawings.

The mounting structure 1 shown in FIG. 1A is manufactured using the method for manufacturing the mounting structure according to the present embodiment, and is used in electronic devices such as various types of audio visual devices, home electronics, communication devices, computer devices, and peripheral devices thereof. The mounting structure 1 includes an electronic component 2 and a circuit board 4 on which the electronic component 2 is flip chip mounted through a bump 3.

The electronic component 2 is a semiconductor element such as an IC or an LSI, where the base material is made from a semiconductor material such as silicon, germanium, gallium arsenide, gallium arsenide phosphide, gallium nitride, or silicon carbide. Such an electronic component 2 has the coefficient of thermal expansion in each direction set to greater than or equal to 3 ppm/° C. and smaller than or equal to 5 ppm/° C.

The coefficient of thermal expansion of the electronic component 2 is measured according to the measurement method complying with JISK7197-1991 using a commercially available TMA apparatus. The coefficient of thermal expansion of each member is measured in a manner similar to the electronic component 2.

The bump 3 is made of a conductive material such as a solder including lead, tin, silver, gold, copper, zinc, bismuth, indium, aluminum, or the like.

The circuit board 4 includes a core substrate 5 and a pair of circuit layers 6 formed above and below the core substrate 5.

The core substrate 5 is provided to enhance the strength of the circuit board 4, and includes a base body 7, a tubular through-hole conductor 8 that passes through the base body 7 in a thickness direction, and a columnar insulator 9 arranged inside the through-hole conductor 8.

The base body 7 is the main part of the core substrate 5 to enhance the rigidity, and includes a resin material, a base material coated by the resin material, and an inorganic insulating filler contained in the resin material. The base body 7 has the thickness set to greater than or equal to 0.1 mm and smaller than or equal to 1 mm, the coefficient of thermal expansion of the base body 7 in the planar direction set to greater than or equal to 5 ppm/° C. and smaller than or equal to 30 ppm/° C., the coefficient of thermal expansion of the base body 7 in the thickness direction set to greater than or equal to 15 ppm/° C. and smaller than or equal to 50 ppm/° C., and the Young's modulus of the base body 7 set to greater than or equal to 5 GPa and smaller than or equal to 30 GPa.

The thickness of the base body 7 is measured by cutting the base body 7 along the thickness direction (Z direction), observing the cut surface with a scanning electron microscope, measuring the length along the thickness direction, and calculating the average value thereof. The Young's modulus of the base body 7 is measured using Nano Indentor XP/DCM manufactured by MTS Systems Co. Hereinafter, the coefficient of thermal expansion of each member is measured similar to the base body 7.

As the resin material contained in the base body 7, a resin material such as epoxy resin, bismaleimide triazine resin, cyanate resin, poly(p-phenylenebenzobisoxazole, wholly aromatic polyamide resin, polyimide resin, aromatic liquid crystal polyester resin, polyether ether ketone resin or polyether ketone resin may be used.

As the base material contained in the base body 7, a woven cloth or a nonwoven cloth made of fibers or a base material in which the fibers are arrayed in one direction may be used. The glass fiber, resin fiber, carbon fiber, metal fiber, or the like may be used as the fiber.

The inorganic insulating filler is contained in the base body 7 for higher rigidity and lower thermal expansion of the base body 7 and may be formed of an inorganic insulating particles. An exemplary material of the inorganic insulating particles may include silicon oxide. The coefficient of thermal expansion of the inorganic insulating particles in each direction is set to greater than or equal to 0 ppm/° C. and smaller than or equal to 7 ppm/° C., and the Young's modulus of the inorganic insulating particles is set to greater than or equal to 20 GPa and smaller than or equal to 30 GPa.

The through-hole conductor 8 electrically connects the upper and lower circuit layers 6 of the core substrate 5, and may be formed of a conductive material such as copper, silver, gold, aluminum, nickel, chromium, or the like.

The insulator 9 forms a supporting surface of a via conductor 13, and may be formed of a resin material such as polyimide resin, acrylic resin, epoxy resin, cyanate resin, fluorine resin, silicon resin, polyphenylene ether resin, or bismaleimide triazine resin.

Figure 1B:
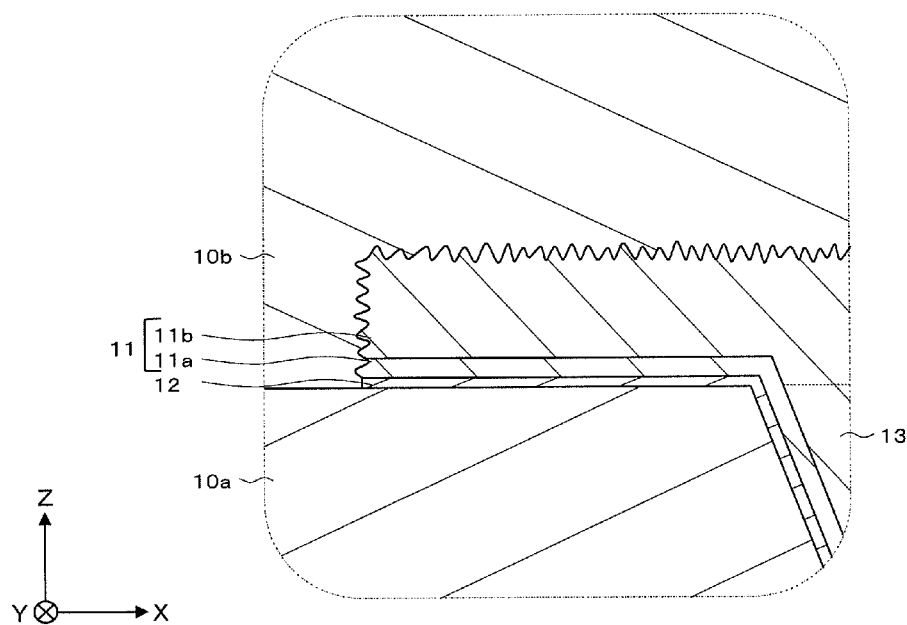
FIG. 1B is a cross-sectional view showing an R1 portion of the mounting structure shown in FIG. 1A in an enlarged manner.

The pair of circuit layers 6 are formed above and below the core substrate 5, as described above. As shown in FIGS. 1A and 1B, the circuit layer 6 includes a plurality of insulating layers 10, a plurality of conductive layers 11, a metal layer 12, and a via conductor 13. The plurality of the conductive layers 11 are arranged on the base body 7 and the insulating layer 10 and are apart from each other in a thickness direction, and the conductive layers 11 on the insulating layer 10 are apart from each other in a planar direction. The metal layer 12 is interposed between the conductive layer 11 and the insulating layer 10, and the via conductor 13 passes through the insulating layer 10.

The insulating layer 10 not only functions as a supporting member for supporting the conductive layer 11 but also functions as an insulating member for preventing short-circuit between the conductive layers 11. The insulating layer 10 includes a first resin layer 10a and a second resin layer 10b arranged on the first resin layer 10a. The thickness of the insulating layer 10 is set to greater than or equal to 5 μm and smaller than or equal to 40 μm.

The first resin layer 10a has a higher Young's modulus and smaller coefficient of thermal expansion in the planar direction than the second resin layer 10b, enhances the rigidity of the insulating layer 10 and reduces the coefficient of thermal expansion in the planar direction, and includes a resin material and an inorganic insulating filler contained in the resin material. The first resin layer 10a is formed into a flat plate shape. One main surface of the first resin layer 10a on a side of the core substrate 5 is in contact with the second resin layer 10b and the other main surface of the first resin layer 10a is in contact with the plurality of conductive layers 11. The first resin layer 10a has the thickness set to greater than or equal to 2 μm and smaller than or equal to 20 μm, the coefficient of thermal expansion of the first resin layer 10a in the planar direction set to greater than or equal to 0 ppm/° C. and smaller than or equal to 30 ppm/° C., the coefficient of thermal expansion of the first resin layer 10a in the thickness direction set to greater than or equal to 20 ppm/° C. and smaller than or equal to 50 ppm/° C., and the Young's modulus of the first resin layer 10a set to greater than or equal to 2.5 GPa and smaller than or equal to 10 GPa.

As the resin material contained in the first resin layer 10a, polyimide resin is used. The first resin layer 10a can have higher rigidity and lower coefficient of thermal expansion by using the polyimide resin. As the polyimide resin, a resin material containing molecules with imide rings may be used. The polyimide resin is desirably a film form having a structure in which molecular chains are parallel to the main surfaces of the first resin layer 10. As a result, the coefficient of thermal expansion in the planar direction can be reduced.

The inorganic insulating filler contained in the first resin layer 10a is made of a plurality of inorganic insulating particles which includes an inorganic insulating material such as silicon oxide. The inorganic insulating material may be the same material as the inorganic insulating particles contained in the base body 7. The content of the inorganic insulating particles in the resin material of the first resin layer 10a is set to greater than or equal to 0.5% by volume and smaller than or equal to 3% by volume.

The content (% by volume) of the inorganic insulating particles in the resin material of the first resin layer 10a is measured by photographing a polished surface of the first resin layer 10a with a field emission type electronic microscope, measuring an area ratio (% by area) occupied by the inorganic insulating particles with respect to the resin material of the first resin layer 10a at ten cross-sections using an image analyzer or the like, and calculating the average of such measurement values to be regarded as the content (% by volume). The content of the inorganic insulating particles in the resin material of the second resin layer 10b is measured in the same manner as the first resin layer 10a.

The second resin layer 10b has a lower Young's modulus than the first resin layer 10a. The second resin layer 10b is brought into contact with each of the first resin layers 10a adjacent in the thickness direction to adhere the first resin layers 10a to each other and is also adhered to the side surface and one main surface of the conductive layer 11 to fix the conductive layer 11. In addition, the second resin layer 10b includes a resin material and an inorganic insulating filler contained in the resin material. The second resin layer 10b has the thickness set to greater than or equal to 2 μm and smaller than or equal to 20 μm, the coefficient of thermal expansion of the second resin layer 10b in each direction set to greater than or equal to 10 ppm/° C. and smaller than or equal to 100 ppm/° C., the coefficient of thermal expansion of the second resin layer 10b in the planar direction set to greater than or equal to two times and smaller than or equal to 100 times the first resin layer 10a, the Young's modulus of the second resin layer 10b set to greater than or equal to 0.05 GPa and smaller than or equal to 0.5 GPa, and the Young's modulus thereof set to greater than or equal to 0.0005 times and smaller than or equal to 0.2 times the first resin layer 10a.

The resin material contained in the second resin layer 10b may be epoxy resin, bismaleimide triazine resin, cyanate resin, amide resin, or the like.

The inorganic insulating filler contained in the second resin layer 10b is made of a plurality of inorganic insulating particles which includes an inorganic insulating material. The inorganic insulating material may be the same material as the inorganic insulating particles contained in the base body 7. The content of the inorganic insulating particles in the resin material of the second resin layer 10b is set to greater than or equal to 20% by volume and smaller than or equal to 30% by volume.

The conductive layer 11 functions as a ground line, a power supply line, or a signal line. The side surface and one main surface of the conductive layer 11 are in contact with the second resin layer 10b and the other main surface of the conductive layer 11 is in contact with the metal layer 12. The conductive layer 11 has a conductivity set higher than the metal layer 12, and the conductive layer 11 formed from a metal material including copper having high conductivity may be used. The thickness of the conductive layer 11 is set to greater than or equal to 3 μm and smaller than or equal to 20 μm.

The conductive layer 11 has microscopic unevenness formed on the side surface and one main surface thereof. As a result, the adhesion strength with the second resin layer 10b can be enhanced and separation between the conductive layer 11 and the second resin layer 10b can be reduced, so that breakage of the conductive layer 11 can be reduced. The surface roughness of the side surface and one main surface of the conductive layer 11 has Ra (arithmetic average roughness) set to greater than or equal to 0.1 μm and smaller than or equal to 1 μm according to such unevenness. The arithmetic average roughness complies with ISO4287:1997.

The conductive layer 11 includes a first layer 11a and a second layer 11b that is arranged on the first layer 11a. The second layer 11b has the grain aggregate of the crystals greater than the first layer 11a and a thickness greater than the first layer 11a. The thickness of the first layer 11a is set to greater than or equal to 0.2 μm and smaller than or equal to 1 μm, and the thickness of the second layer 11b is set to greater than or equal to 2 μm and smaller than or equal to 19 μm.

The first layer 11a and the second layer 11b can be checked by cutting the conductive layer 11 along the thickness direction, and observing the cut surface using a scanning ion microscope.

The metal layer 12 is brought into contact with the conductive layer 11 and the first resin layer 10a to adhere the conductive layer 11 and the first resin layer 10a. The metal layer 12 may be made from a metal material including titanium, molybdenum, chrome, or nickel chrome alloy. The metal material in the metal layer 12 are less likely to be ionized and liberated at the interface with the first resin layer 10a compared with the copper in the conductive layer 11, and hence the adhesion strength of the metal layer 12 and the first resin layer 10a can be enhanced. The metal layer 12 has the thickness set to greater than or equal to 0.03 μm and smaller than or equal to 0.1 μm, which thickness being set to greater than or equal to 0.0015 times and smaller than or equal to 0.033 times the conductive layer 11, and the Ra (arithmetic average roughness) of the side surface set to greater than or equal to 0.01 μm and smaller than or equal to 0.5 μm.

The via conductor 13 connects the conductive layers 11 to each other apart in the thickness direction, and is formed in a columnar shape having the width narrower towards the core substrate 5. A metal material such as titanium, molybdenum, chrome, or nickel chrome alloy may be used to form the via conductor 13.

The mounting structure 1 described above exhibits the desired functions by driving or controlling the electronic component 2 based on the power supply or the signal supplied through the circuit board 4.

The method for manufacturing the mounting structure 1 is described based on FIG. 2A to FIG. 7.

Figure 2A:
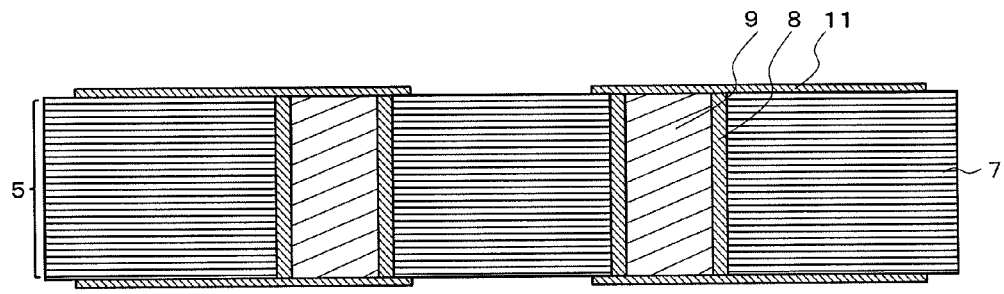
FIGS. 2A and 2B are cross-sectional views of the mounting structure taken along the thickness direction for describing the manufacturing process of the mounting structure shown in FIG. 1A.

(1) As shown in FIG. 2A, the core substrate 5 is prepared.

Specifically, first, the base body 7 is manufactured by stacking a plurality of non-cured resin sheets and stacking a copper foil on the outermost layer, and then curing the stacked body through heating and pressurizing. The non-cured state is a state of A-stage and B-stage complying with ISO472:1999. The through-hole passing through the base body 7 in the thickness direction is formed by drilling, laser processing, and the like. A conductive material is applied on the inner wall of the through-hole through non-electroplating, electro-deposition, evaporating, CVD, sputtering, or the like to form the through-hole conductor 8. The resin material, or the like is then filled inside the through-hole conductor 8 to form the insulator 9. After the conductive material is applied on the exposed portion of the insulator 9, the copper foil is patterned through the conventionally well-known photolithography technique, etching, or the like to form the conductive layer 11.

The core substrate 5 can be manufactured in such manner.

Figure 2B:
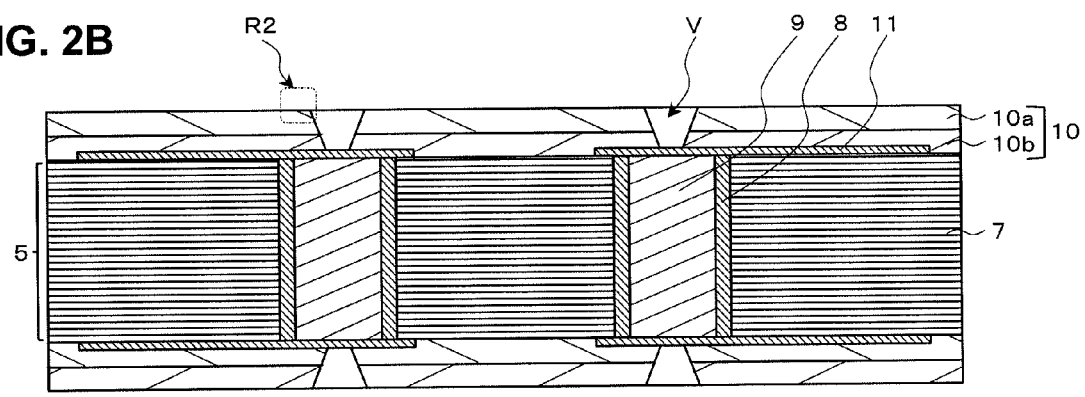
Figure 2C:
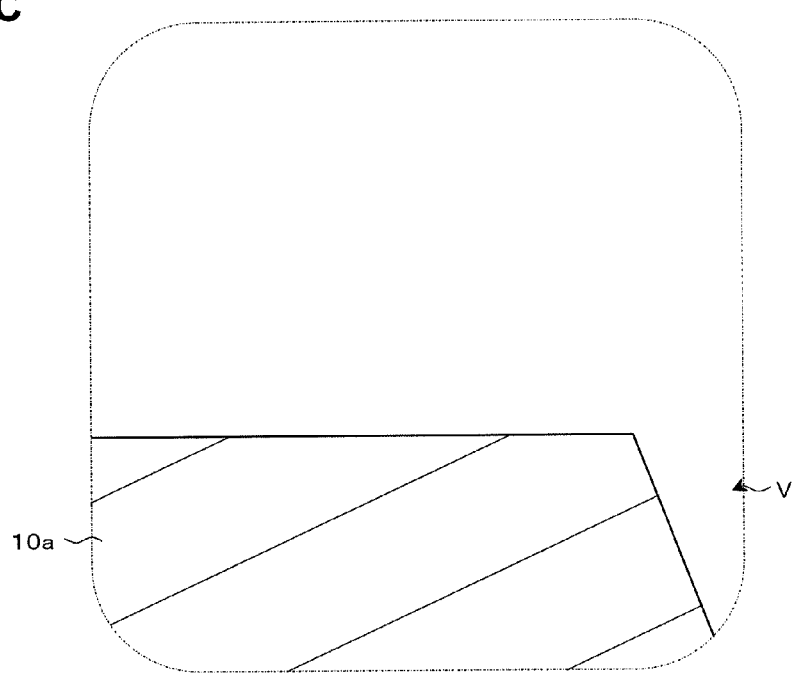
FIG. 2C is a cross-sectional view showing an R2 portion of the mounting structure shown in FIG. 2B in an enlarged manner.

(2) As shown in FIG. 2B and FIG. 2C, the insulating layer 10 is formed on the conductive layer 11, and the via hole V is formed in the insulating layer 10.

Specifically, first, after the film-like first resin layer 10a is arranged on the conductive layer 11 through the non-cured second resin layer 10b, the core substrate 7, the second resin layer 10b, and the first resin layer 10a are heated and pressurized to cure the second resin layer 10b, thereby forming the insulating layer 10 on the conductive layer 11. Then, the via hole V is formed in the insulating layer 10 by the YAG laser device or the carbon dioxide laser device, for example, so that at least one part of the conductive layer 11 is exposed in the via hole V.

Figure 3A:
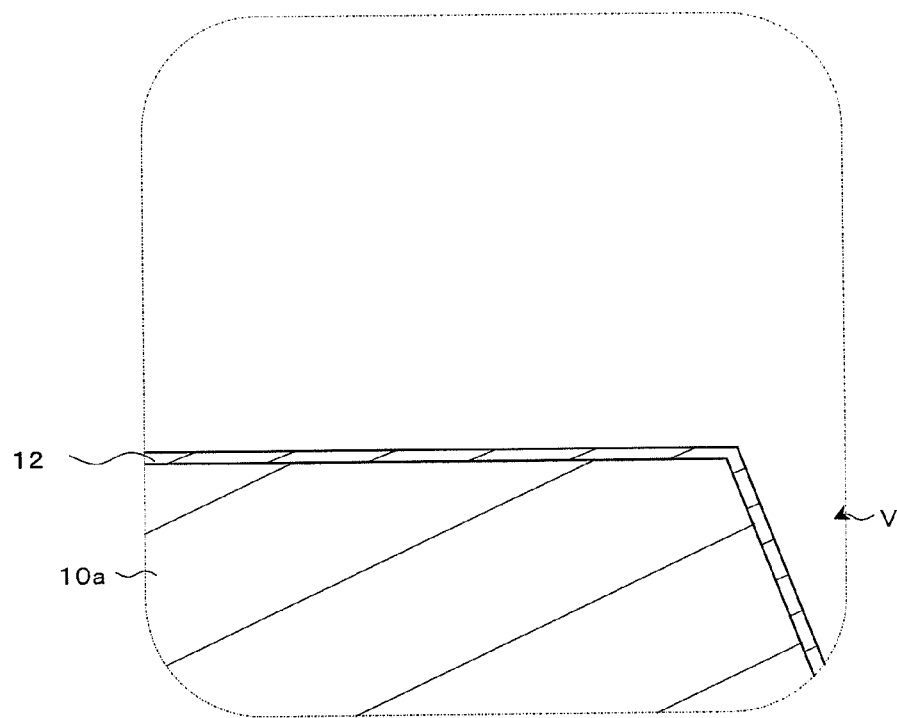
FIGS. 3A and 3B are cross-sectional views showing the portion corresponding to the R2 portion of FIG. 2B in an enlarged manner describing the manufacturing process of the mounting structure shown in FIG. 1A.

(3) As shown in FIG. 3A, the exposed surface of the first resin layer 10a is coated with the metal layer 12 by applying the metal layer 12 on the exposed surface of the first resin layer 10a using a sputtering device or an evaporating device.

Figure 4A:
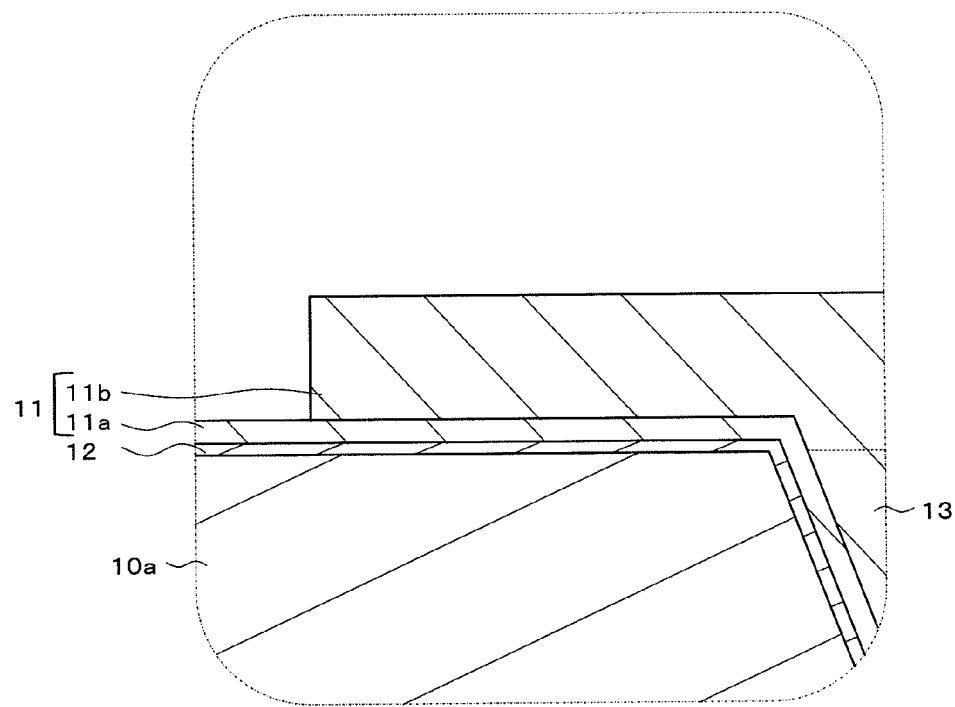
FIGS. 4A and 4B are cross-sectional views showing the portion corresponding to the R2 portion of FIG. 2B in an enlarged manner describing the manufacturing process of the mounting structure shown in FIG. 1A.
Figure 4B:
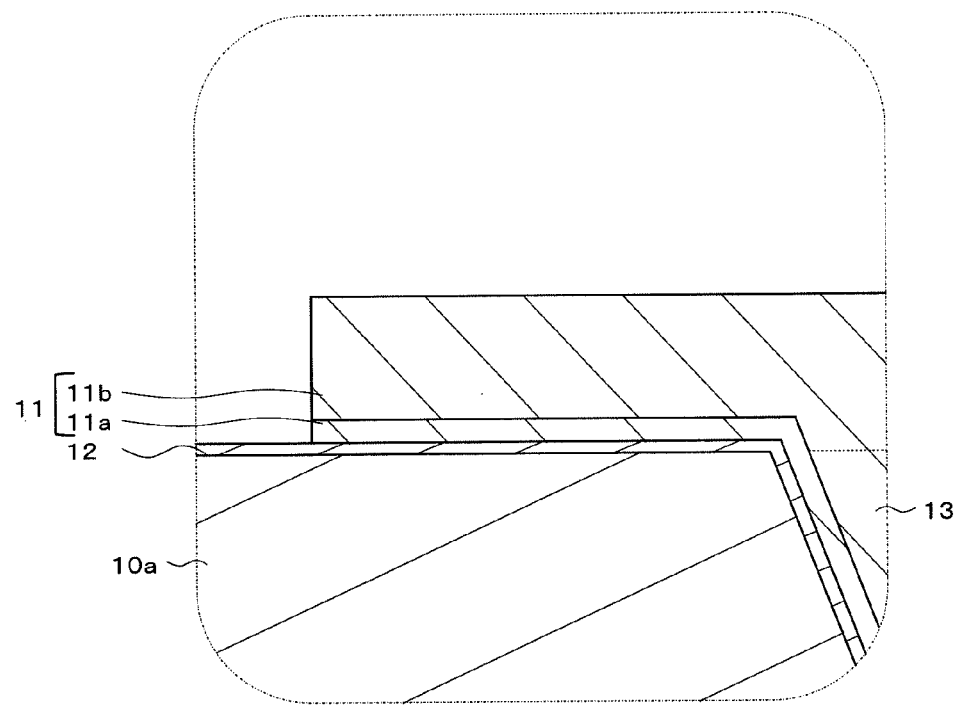

(4) As shown in FIG. 4B, a plurality of conductive layers 11 is formed on a part of the metal layer 12, and the via conductor 13 is formed in the via hole V.

Figure 3B:
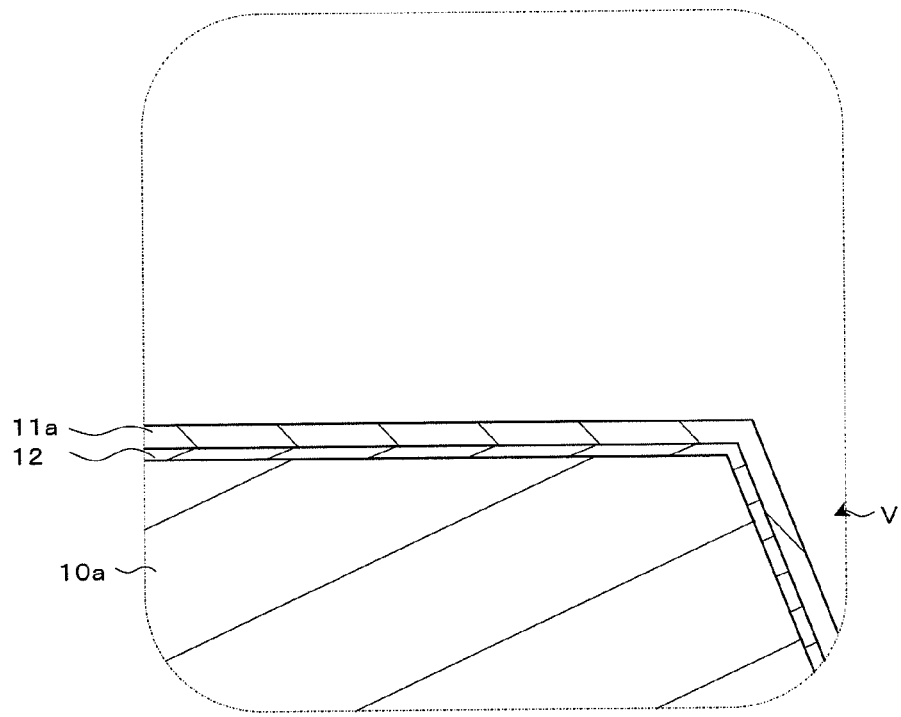

Specifically, first, as shown in FIG. 3B, the first layer 11a of the conductive layer 11 is applied on the exposed surface of the metal layer 12 by a sputtering method or an evaporating method. Then, as shown in FIG. 4A, a plurality of second layers 11b is formed on a part of the first layer 11a with the first layer 11a as the seed layer, and the via conductor 13 is formed in the via hole V through electro-deposition using a resist. As shown in FIG. 4B, the first layer 11a exposed from the second layer 11b is etched with an etching solution such as a mixed solution of hydrochloric acid and sulfuric acid, mixed solution of hydrogen peroxide solution and aqueous sodium hydroxide, aqueous ferric chloride, or aqueous copper chloride to form a plurality of conductive layers 11 including the first layer 11a and the second layer 11b and expose the metal layer 12 between the conductive layers 11 apart from each other in a planar view.

Thus, the first layer 11a can be formed on the metal layer 12 by a sputtering method or an evaporating method. These methods can reduce oxidation of the metal layer 12 during by forming the first layer 11a compared to a case of plating method. As a result, the adhesion strength between the metal layer 12 and the first layer 11a can be enhanced. Furthermore, the second layer 11b can be efficiently formed by electro-plating method.

Figure 5:
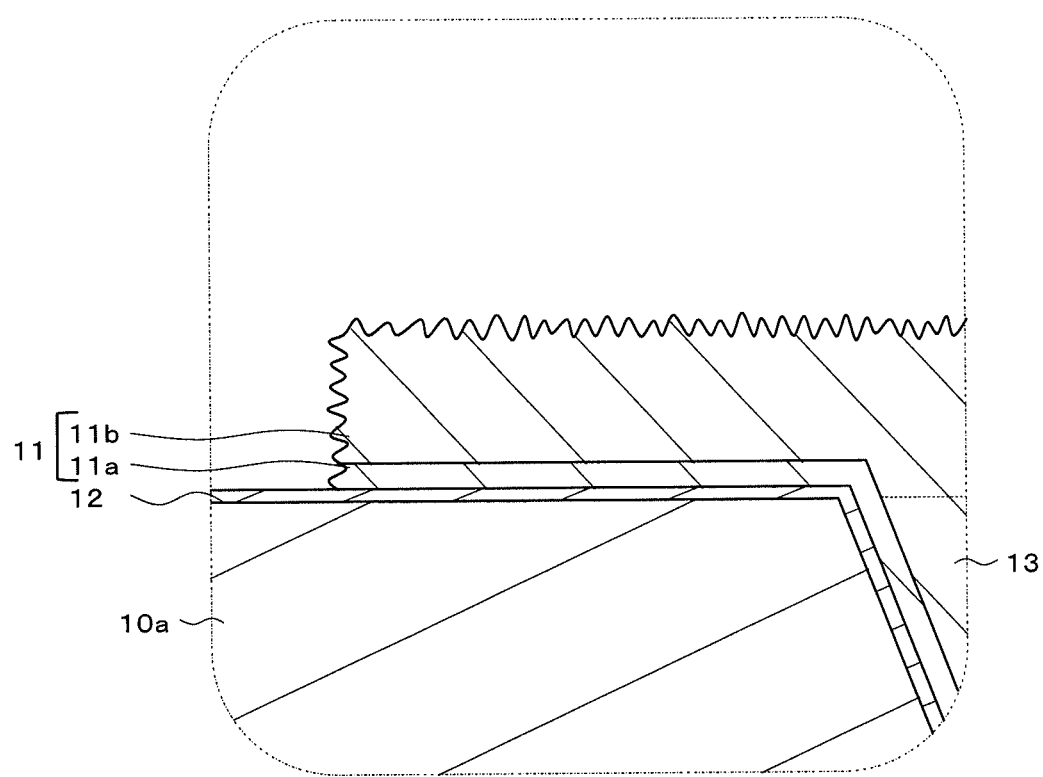
FIG. 5 is a cross-sectional view showing the portion corresponding to the R2 portion of FIG. 2B in an enlarged manner describing the manufacturing process of the mounting structure shown in FIG. 1A.

(5) As shown in FIG. 5, the surface of the conductive layer 11 is roughened using alkaline aqueous solution.

First, the insulating layer 10, the conductive layer 11, and the metal layer 12 are immersed in an aqueous solution containing palladium chloride to attach the palladium to the surface of the conductive layer 11 in such a manner that the palladium are dispersed.

The insulating layer 10, the conductive layer 11, and the metal layer 12 are then immersed in an aqueous solution of alkaline oxidant containing sodium chlorite and sodium hydroxide to oxidize part of the exposed surface of the conductive layer 11 with palladium as the starting point. Then, by crystal growth of the copper oxide formed through oxidation, projections made of copper oxide acicular crystals are formed on the side surface and the upper surface of the conductive layer 11. As a result, the entire surface of the conductive layer 11 can be uniformly oxidized since the threshold value of the oxidation reaction can be lowered by the palladium dispersed over the surface of the conductive layer 11. Therefore, projections can be formed more uniformly and densely, and furthermore, microscopic unevenness can be formed.

In the manufacturing method of the circuit board 4 of the present embodiment, the surface of the first resin layer 10a of the insulating layer 10 is coated by the metal layer 12 between the conductive layers 11 during the process using the alkaline aqueous solution. As a result, the metal layer 12 protects the surface of the first resin layer 10a from the alkaline aqueous solution, and the contact between the polyimide resin contained in the first resin layer 10a and the alkaline aqueous solution is suppressed, so that the hydrolysis of the imide ring of the polyimide resin by the alkaline aqueous solution is suppressed. Therefore, the insulation property between the circuit layers can be enhanced by suppressing the generation of the carboxyl group by the hydrolysis.

Furthermore, the rigidity of the first resin layer 10a can be maintained by reducing the damage of the polyimide resin due to the hydrolysis. The adhesion strength between the first resin layer 10a and the second resin layer 10b can be enhanced when forming the second resin layer 10b on the first resin layer 10a in the process of (7), to be described later, by reducing the damage of the polyimide resin due to the hydrolysis.

Figure 6A:
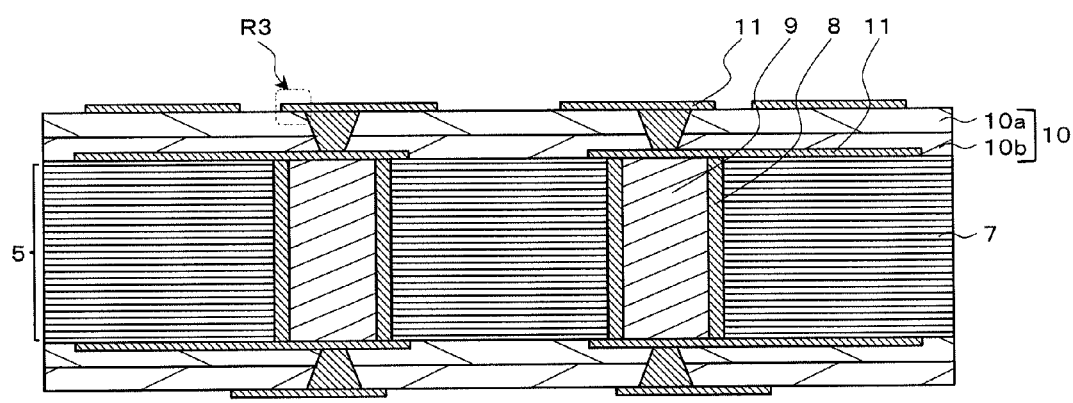
FIG. 6A is a cross-sectional view cut along a thickness direction describing the manufacturing process of the mounting structure shown in FIG. 1.
Figure 6B:
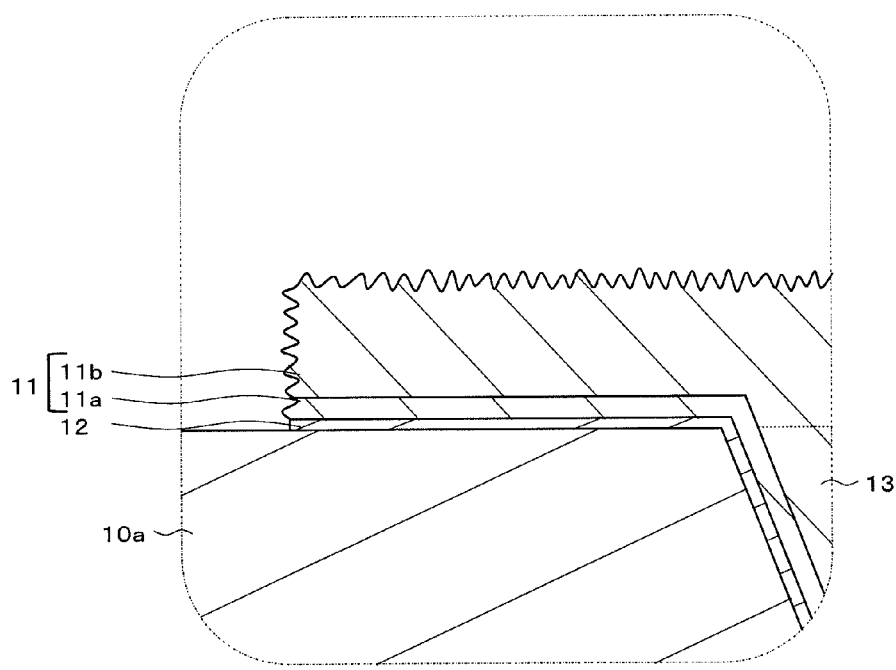
FIG. 6B is a cross-sectional view showing the R3 portion of the mounting structure shown in FIG. 6A in an enlarged manner.

(6) As shown in FIGS. 6A and 6B, the first resin layer 10a is exposed between the metal layers 12 by etching part of the metal layer 12 with the conductive layer 11 as the mask.

Here, the metal layer 12 rather than the conductive layer 11 is desirably etched when etching the metal layer 12. As a result, the metal layer 12 can be etched while maintaining the unevenness on the surface of the conductive layer 11.

The mixed solution of sulfuric acid and hydrochloric acid can be used for the selective etching of the metal layer 12 if the metal layer 12 is made from chrome or nickel chrome alloy, and the aqueous sodium hydroxide and hydrogen peroxide solution can be used if the metal layer 12 is made of titanium.

Figure 7:
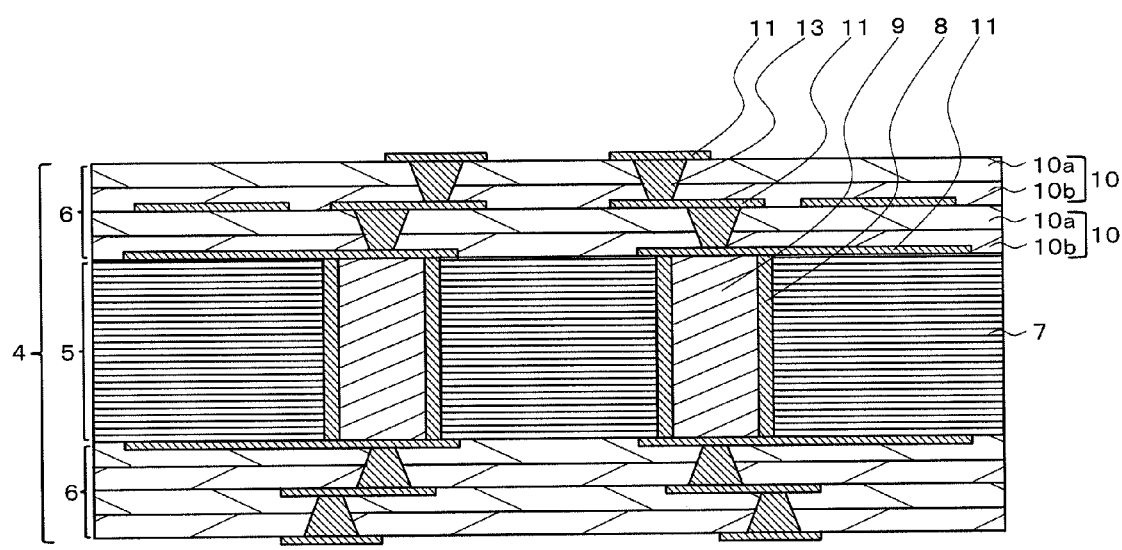
FIG. 7 is a cross-sectional view cut of the mounting structure along a thickness direction describing the manufacturing process of the mounting structure shown in FIG. 1A.

(7) As shown in FIG. 7, the circuit layer 6 is formed and the circuit board 4 can be manufactured by repeating the steps of (2) to (6).

(8) The mounting structure 1 shown in FIG. 1 can be manufactured by flip-chip mounting the electronic component 2 on the circuit board 4 through the bump 3.

The present invention is not limited to the embodiment described above, and various modifications, improvements, combinations, and the like may be made within a scope not deviating from the gist of the invention.

For instance, the configuration in which the circuit layer is formed of two insulating layers has been described by way of example in the embodiment described above, but three or more insulating layers may be arranged.

The configuration in which the base body made of resin is used has been described by way of example in the embodiment described above, but the base body made of ceramic or the base body in which the metal plate is coated with resin may be used.

In the step of (2) of the embodiment described above, the configuration in which the conductive layer is formed through the semi-additive method has been described by way of example, but the conductive layer may be formed through the full-additive method or the subtractive method.

What is claimed is:

1. A method for manufacturing a circuit board comprising:
covering a surface of a first resin layer including polyimide resin with a metal layer;
forming a plurality of conductive layers arranged apart from each other in a planer view on the metal layer;
roughening surfaces of the conductive layers with an alkaline aqueous solution; and
etching a part of the metal layer between the conductive layers in the planer view to expose the surface of the first resin layer after roughening the surfaces of the conductive layers.

2. The method for manufacturing the circuit board according to claim 1, wherein
covering the surface of the first resin layer with the metal layer comprises:
forming the metal layer by sputtering or evaporating.

3. The method for manufacturing the circuit board according to claim 2, wherein
each of the conductive layers has a first layer and a second layer on the first layer, and
forming the conductive layers comprises:
covering a surface of the metal layer with the first layer by sputtering or evaporating;
forming a plurality of second layers arranged apart from each other in the planer view on the first layer by electroplating; and
etching a part of the first layer exposed between the second layers in the planer view.

4. The method for manufacturing the circuit board according to claim 1, wherein
etching the part of the metal layer comprises:
etching the metal layer without etching the conductive layers.

5. The method for manufacturing circuit board according to claim 1, comprising:
forming a second resin layer which is in a direct contact with the exposed surface of the first resin layer.

6. The method for manufacturing the circuit board according to claim 1, wherein
the metal layer includes titanium, molybdenum, chrome, or nickel chrome alloy, and
the conductive layers include copper.

7. A method for manufacturing a structure comprising:
connecting an electronic component electrically to a circuit board manufactured by the method according to claim 1.

* * * * *